United States Patent [19]
Roberts

[11] Patent Number: 5,819,579
[45] Date of Patent: Oct. 13, 1998

[54] FORMING DIE FOR MANUFACTURING PRINTED CIRCUITS

[75] Inventor: Joseph A. Roberts, Grafton, N.H.

[73] Assignee: Research Organization for Circuit Knowledge, Nashua, N.H.

[21] Appl. No.: 622,243

[22] Filed: Mar. 25, 1996

Related U.S. Application Data

[60] Division of Ser. No. 358,855, Dec. 19, 1994, Pat. No. 5,528,001, which is a continuation-in-part of Ser. No. 16,002, Feb. 10, 1993, Pat. No. 5,477,612, which is a continuation-in-part of Ser. No. 837,357, Feb. 14, 1992, Pat. No. 5,343,616.

[51] Int. Cl.$^6$ .................................................. B21D 37/00
[52] U.S. Cl. ............................. 72/412; 72/414; 72/379.6; 29/846
[58] Field of Search ........................ 72/412, 474, 409.13, 72/385, 379.6, 414; 29/835, 853, 846

[56] References Cited

U.S. PATENT DOCUMENTS

| | | |
|---|---|---|
| 2,427,144 | 9/1947 | Jansen . |
| 2,535,674 | 12/1950 | Franklin ..................................... 72/385 |
| 2,638,660 | 5/1953 | Van Gessel . |
| 2,716,268 | 8/1955 | Steigerwalt . |
| 2,837,619 | 6/1958 | Stein . |
| 2,861,911 | 11/1958 | Martin et al. . |
| 2,912,745 | 11/1959 | Steigerwalt et al. . |
| 2,912,746 | 11/1959 | Oshry et al. . |
| 2,912,748 | 11/1959 | Gray . |
| 3,037,265 | 6/1962 | Kollmeier ................................. 29/853 |
| 3,147,054 | 9/1964 | Alexander et al. . |
| 3,148,098 | 9/1964 | Beste, Jr. . |
| 3,158,421 | 11/1964 | Hasenauer, Jr. . |
| 3,301,730 | 1/1967 | Spiwak et al. . |
| 3,423,260 | 1/1969 | Heath . |
| 3,434,208 | 3/1969 | Toomey et al. . |
| 3,488,890 | 1/1970 | Owens et al. . |
| 3,523,802 | 8/1970 | Spall . |
| 3,612,745 | 10/1971 | Warren . |
| 3,875,542 | 4/1975 | Holland . |
| 3,889,363 | 6/1975 | Davis . |
| 4,020,548 | 5/1977 | Pohl . |
| 4,075,420 | 2/1978 | Walton . |
| 4,080,027 | 3/1978 | Benasutti . |
| 4,089,734 | 5/1978 | Bierig . |
| 4,091,125 | 5/1978 | Delgadillo . |
| 4,246,563 | 1/1981 | Noerholm . |
| 4,272,753 | 6/1981 | Nicolay . |
| 4,306,925 | 12/1981 | Lebow et al. . |

(List continued on next page.)

FOREIGN PATENT DOCUMENTS

| | | |
|---|---|---|
| 1 515 382 | 10/1969 | Germany . |
| 2 136 386 | 7/1971 | Germany . |
| 42030 | 10/1972 | Japan ................................... 72/379.2 |

OTHER PUBLICATIONS

Action News, Spring/Summer 1990, Action Technologies, Inc. "Molded Flexible Circuits".

IBM Technical Disclosure bulletin; vol. 9, No. 3; Aug. 19, 1966; pp. 236–237; D.G. Pittwood et al.

*Primary Examiner*—Daniel C. Crane
*Attorney, Agent, or Firm*—Davis and Bujold

[57] ABSTRACT

A process and apparatus for producing supported conductive networks which can be flexible or rigid, having densely packed circuits. The process and apparatus for making the conductive network involves forming a conductive material supported on a "dynamic pressure cushion" into a nonplanar pattern defining the desired conductive circuits in relation to a fixed reference plane. The "dynamic pressure cushion" is a material having suitable viscosity and flow characteristics to flow out from under the conductive material as it is being formed and fill up any voids. To ensure that the "dynamic pressure cushion" properly flows without deforming the desired circuits, the die used to form the conductive material is provided with a material flow control grid and material expansion troughs. After forming the unwanted material is then mechanically removed in dimensional relation to the reference plane leaving the desired conductive circuits.

10 Claims, 9 Drawing Sheets

U.S. PATENT DOCUMENTS

| | | | |
|---|---|---|---|
| 4,325,771 | 4/1982 | Brower | 29/835 |
| 4,357,750 | 11/1982 | Ostman . | |
| 4,406,062 | 9/1983 | Navarro . | |
| 4,528,259 | 7/1985 | Sullivan . | |
| 4,532,152 | 7/1985 | Elarde . | |
| 4,604,799 | 8/1986 | Gurol . | |
| 4,651,417 | 3/1987 | Schumacher, III . | |
| 4,655,518 | 4/1987 | Johnson et al. . | |
| 4,721,550 | 1/1988 | Schumacher, III . | |
| 4,775,611 | 10/1988 | Sullivan . | |
| 4,840,702 | 6/1989 | Schumacher, III . | |
| 5,088,009 | 2/1992 | Harada et al. . | |
| 5,097,101 | 3/1992 | Trobough . | |
| 5,161,403 | 11/1992 | Kitchens | 29/846 |
| 5,184,111 | 2/1993 | Pichl . | |
| 5,277,052 | 1/1994 | Braunheim | 72/414 |

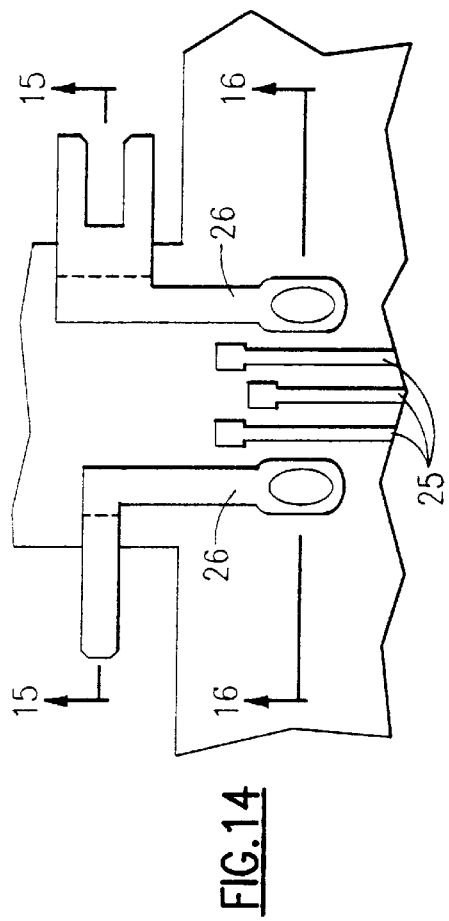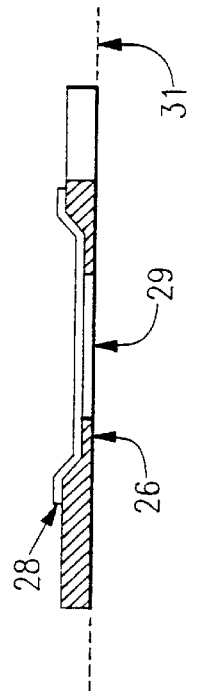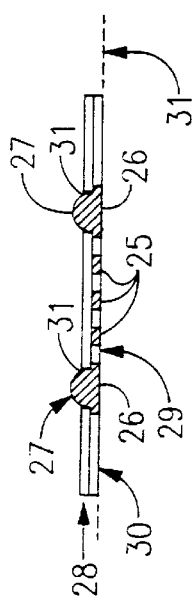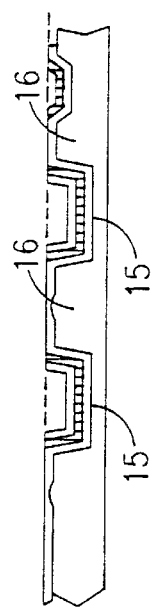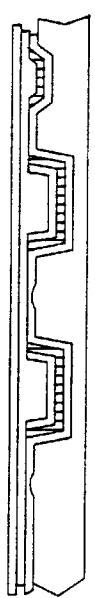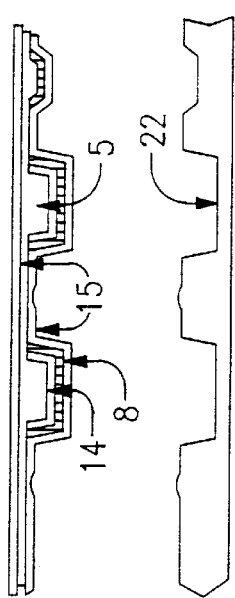

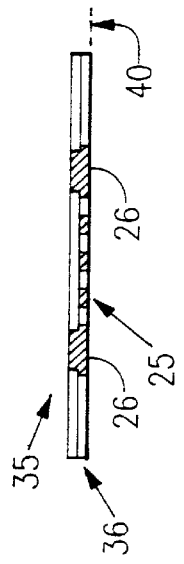
FIG.23
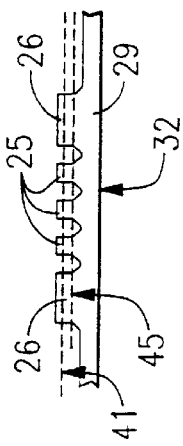
FIG.24
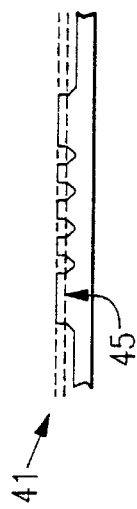
FIG.25
FIG.26
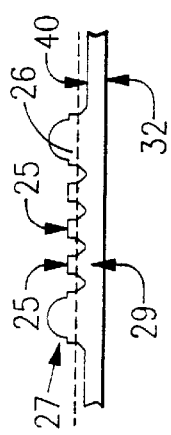
FIG.27
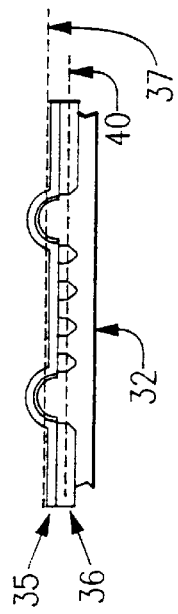
FIG.28
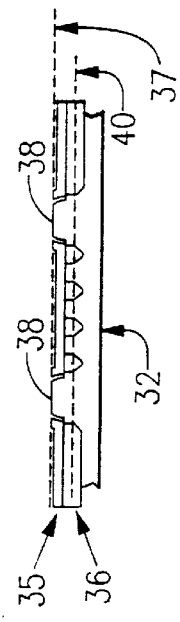
FIG.29

FORMING DIE FOR MANUFACTURING PRINTED CIRCUITS

This is a divisional of application Ser. No. 08/358,855, filed on Dec. 19, 1994, now U.S. Pat. No. 5,528,001, which is a continuation-in-part of U.S. patent application Ser. No. 08/016,002 filed Feb. 10, 1993, now U.S. Pat. No. 5,477,612, which in turn is a continuation-in-part of U.S. patent application Ser. No. 07/837,357, filed Feb. 14, 1992, now U.S. Pat. No. 5,343,616.

FIELD OF THE INVENTION

This invention generally relates to an environmentally desirable method for producing high density electrically conductive networks supported by a layer of flexible or rigid dielectric, which have densely packed conductive paths, the supported networks themselves and associated apparatus.

Definitions

The term "Conductor" as used herein shall be construed to be an electrical conductor.

The term "Reference plane" as used throughout the specification and claims is intended to include planar, cylindrical (i.e. a roller) and any other single curvature surface appropriate to a given manufacturing situation as well as the preferred planar surface.

The term "die" as used herein includes planar, cylindrical, or curved dies that cooperate with a planar, cylindrical, or single curved support surface arranged to provide support at the reference plane.

The term "Dynamic Pressure Cushion" is used herein to describe the characteristics of an adhesive, dielectric and/or compliant carrier used to support a conductive foil during formation of a conductive network of the invention. The dynamic pressure cushion has a viscosity during forming which is fluid enough to allow the carrier to flow out from under depressed circuit forming portions of the foil and to fill all voids under the foil while being viscous enough to support and even raise the waste material to a prescribed level for waste removal.

The term "Control Grid" as used herein refers to features of the die arranged, positioned and dimensioned to control movement of the carrier during formation of a conductive network of the invention.

The term "parallel" as used herein shall be construed to include "coincident with" e.g. a plane coincident with a surface of a lamina.

The term "thin" as used herein shall be construed to define a layer of metallic or dielectric material having a thickness of less than 0.13 mm (0.005"), preferably in the range of 0.018 mm (0.0007") to 0.11 mm (0.0042").

BACKGROUND OF THE INVENTION

One class of supported networks to which the present invention relates is frequently characterized by the term "printed circuits." (The term "circuit" will be used to signify one or more conductors, combinations thereof, electrical, including magnetic components per se, or such components and associated conductors.) The term "printed circuits" originates from the technique of printing the electrical assembly, which may comprise, for example, a network of conductors, the stator of a switch or the rotor of a motor, on an insulated base by means of the selective deposition of a conductive material thereon in conformity with the desired circuit configuration. Electrolytic, electroless and mechanical (spraying, sputtering, etc.) techniques have been employed to provide this printing operation.

In addition to the above, the term "printed circuits" has been applied to components, assemblies or circuits formed by techniques of selectively removing sections from an insulation-backed conductive blank, by selectively etching the non-conductive regions, the conductive components being protected by an etch resist printed on the blank in conformity with the desired circuit configuration.

In addition to the production of printed circuits, the methods of the invention are applicable to the production of other electrical components heretofore produced by solely mechanical means such as by stamping.

Burdening all of the foregoing techniques are certain limitations. Many of the techniques are not sufficiently accurate, require expensive machinery and are frequently impractical where a design is to be mounted on or laminated to an insulated base. The usual printed circuit techniques are environmentally undesirable and incompatible with the requirements for mass production, needing elaborate environmental control, having a susceptibility to latent defects in the resultant product (and thus requiring rigorous quality control), and being relatively expensive. Frequently it is necessary to provide temporary supports during various production stages. Moreover, the strength of many printed circuits leaves much to be desired. Generally, only relatively thin, flat structures can be produced. This, together with high resistivity and tendencies to delaminate and deteriorate under certain conditions have limited the applicability of these circuits. In spite of this, the trend is toward wider adoption of printed circuit techniques, this being due in part to the increasing emphasis on weight reduction and miniaturization and to the prohibitive costs in time, labor and materials of conventional circuit wiring and cabling procedures.

Developments in the electronics industry require the use of more densely packed electrical modules and circuits, each requiring multiple interconnections to one another. However, there is a practical limit to the density that can be achieved using conventional conductive networks. In a typical present day application, a floppy disk drive may require a connection to a recording head whose conductors are only on the order of 0.2 mm (0.008 inches) on center and associated jumper conductors must have a similar spacing. Further, recent liquid crystal displays have conductors which are even more closely packed, for example, 0.1 mm (0.004 inches) on center, with similar requirements for interconnection conductors. In addition, there is growing use of ceramic PC boards to accommodate multiple IC chip arrays which also require high density connectors and custom interconnect cables for purposes of terminating those components.

As a direct result of the growth in the circuit board industry, there has been a parallel increase in the volume of environmentally-hazardous chemicals generated by the conventional etching and deposition processes. For example, it is not uncommon for one circuit board fabrication facility to generate 4,000 liters (1,000 U.S. gallons) per day of photo resist stripper and 4,800 liters (1,200 U.S. gallons) per week of developer solution. These toxic wastes must be transported off-site for proper disposal at hazardous waste management sites. Thus, there is an urgent need for a practical non-chemical method for the manufacture of conductive networks, particularly high density conductive networks.

It is known to form a planar electrically conductive sheet into a non-planar pattern in a purely mechanical process, i.e. no etching is involved, by forming a conductive foil to define a circuit pattern spaced by waste material, the foil being attached to a dielectric material before, during or after forming, and surface machining the waste material off. However, the known methods of mechanically forming circuits have never been able to attain commercial acceptance due to technical problems and are unable to produce the high density networks required by modern technology.

One significant technical problem, ignored by the prior art, is what happens to the adhesive or dielectric when forming a planar electrically conductive sheet into a non-planar pattern. The known prior art suggests that the adhesive and/or dielectric is compressed into a smaller space. This is both dimensionally impractical and extremely unstable, as it builds compression stresses into the structure. As the waste material is machined off, the compressed material expands changing the location of conductors in the X, Y and Z planes thereby altering the desired circuit pattern, perhaps even causing portions of the desired circuits to be removed. This condition virtually eliminates any possibility of accomplishing the precision machining required to create fine line conductors in a high density network circuit. All known prior art ignores one or more of the following fundamental technical problems that have prevented these known processes from achieving any degree of commercial success. Current art does not teach us how to:

1. Form a sheet of conductive material as thin as or thinner than 0.02 mm (0.0007") thick sheet of conductive material into a non-planar pattern and protect its formed shape as it is processed through lamination and machining operations without damaging the formed structure;
2. Form a laminate, consisting of a conductive material attached to a dielectric, while maintaining the flatness and precise location of conductors within the structure as is necessary to successfully remove all waste and maintain the desired conductor thickness;
3. Form a laminate, consisting of a conductive material attached to a dielectric, while maintaining a substantially flat and stable reference plane necessary for precise location of conductors within the structure and for precise removal of waste material.
4. Eliminate the distortion, resulting from compression stresses, that occurs as waste material flows away from the embossed pattern. NOTE: Material must be undistorted for the accurate grinding of waste material off;
5. Stabilize, support and entrap a thin conductor (e.g. 0.02 mm (0.0007") thick and 0.025 mm (0.001") wide), to prevent its movement or delamination, as the waste material is mechanically ground off;
6. Emboss a conductive foil into an adhesive layer less than half its thickness. (e.g. Embossing a 0.04 mm (0.0014") thick conductive foil (circuit pattern) into an adhesive layer less than 0.02 mm (0.0007") thick and surface machining off the waste material off leaving a 0.04 mm (0.0014") thick conductor;
7. Create a finished circuit with a variety of conductor thicknesses designed to accommodate specific electrical and/or mechanical requirements;
8. Eliminate the technical and cost limitations related to preparing and applying a dielectric overlay;
9. Attach a temporary carrier that is generally a "compliant material" and as such can be conditioned (heat and/or pressure) to assists in first forming a structure (either a laminate consisting of a conductive material attached to a dielectric or conductive material) and once formed, maintaining that structure's critical dimensions (flatness of the temporary carrier necessary to establish and maintain a true machining reference plane based on the location of the conductors and the desired conductor thickness) necessary to successfully remove all waste material and maintain the desired conductor thickness.

Due to the technical problems experienced by the prior art techniques they are unable to mass produce high density, multiple fine line circuit networks. The known techniques are limited to relatively thick, low density circuits and are therefore unsuited to meet today's demand for high density, fine line conductive circuits, for example multiple conductors spaced at 0.1 mm (0.004") on center.

It is a primary object of the present invention to provide a method of manufacturing a relatively inexpensive, high-quality, densely packed, supported conductive network for use in fabricating rigid or flexible circuit boards, without the use or generation of environmentally hazardous chemicals.

Other objects of the invention are to overcome shortcomings of the prior art as set forth in the numbered subparagraphs above and, in particular, to provide a method of forming a planar conductive material into a non-planar pattern either independently or when attached to a dielectric, in which:

a) the formed conductors may be positioned in spaced relationship to each other and to a fixed reference plane, defined by, for example, the dielectric, to ensure proper waste removal and conductor shaping, thickness, width and configuration);
b) a conditioned adhesive and/or dielectric is used to receive, capture and support a formed conductor pattern and to eliminate half of a die set (either the male, when extruding a conductive material or a female when forming a foil/dielectric laminate);
c) each individual conductor is supported on at least three of its four sides, through the lamination and machining operations to ensure that the conductors are not separated from the dielectric;
d) a flexible conductive network forms conductive paths which are profiled to self-align with corresponding conductors of other conductive networks;
e) a thin sheet of conductive material is formed into a non-planar pattern and processed without damaging the formed structure;
f) the flatness and precision, of a laminate, necessary to remove waste and maintain the desired conductor thickness is accurately maintained;
g) distortion problems that occur during the forming operations in the prior art are eliminated;
h) a method able to stabilize, support and entrap a thin conductor to prevent delamination as the waste material is ground off is provided;
i) a conductive foil is embossed into an adhesive layer less than half it's thickness.

SUMMARY OF THE INVENTION

Simply stated the method of the present invention relies on four basic principles for creating a conductive circuit pattern, namely:

1) Forming, a planar conductive material into a non-planar pattern defining a desired circuit pattern;
2) Positioning the formed conductors in a fixed spaced relationship to each other and to a reference plane, such as the planar exposed surface of a dielectric fast with the formed foil. This "reference plane" is critical to proper waste removal and conductor shaping (thickness, width and configuration) in high density conductive networks;

3) Providing an adhesive and/or dielectric having a characteristics suitable to receive, capture and support a formed conductor pattern and controlling its flow during the forming operation. Use of an adhesive and/or dielectric in a state having the correct viscosity allows the elimination of half of a die set (either the male half when extruding a conductive material or the female half when forming a laminate); and 4) Supporting each individual conductor, on at least three of its four sides, through the lamination and grinding operations. This support ensures that the conductors do not separate from the dielectric.

According to the invention there is provided a forming die for forming a conductive metallic lamina, supported on a substrate, into a non-planar pattern defining a desired network of electrically conductive paths, said die comprising a forming surface defining conductive path forming features, for forming the conductive lamina into said non-planar pattern relative to a reference surface, and defining flow control grid features, the grid features being sized, shaped and arranged for controlling the flow of the substrate during forming to ensure that the substrate flows, as the lamina is being formed, to relieve compression stresses and to fill any voids created during forming, to insure that the substrate supports the lamina at desired levels during forming.

According to the invention there is also provided an electrically conductive circuit comprising a network of electrically conductive paths, said paths being supported on three sides thereof and electrically insulated from each other by a dielectric that fills the areas between adjacent paths; wherein a grid of isolated conductive features, that are electrically insulated from the paths by the dielectric and are supported by the dielectric in the areas between adjacent paths.

According to the invention there is also provided a laminate, for use in manufacturing a network of support electrically conductive paths, comprising an electrically conductive sheet having a dielectric fast with a first surface thereof, wherein a surface of the dielectric opposite the sheet is substantially flat and defines a reference plane; said conductive sheet is formed in a non-planar pattern defining desired electrically conductive paths at least a first level relative to the reference plane, areas of unwanted waste conductive material at a second level relative to the reference plane, and flow control grid features located in the areas of waste conductive material and that are isolated from the desired conductive paths by the waste conductive material.

Unlike some conventional techniques for fabricating conductive networks (for example, etching and deposition), the process of this invention does not use etchant, environmentally-hazardous resist, stripper, and developer solutions. Thus, the expense and environmental hazards associated with having the resist, stripper and developer waste solutions transported to toxic waste management sites is eliminated. Further, the process of this invention eliminates common yield problems associated with conventional etched circuits, e.g. art work distortion, scratched or bad acid resistant ink, inconsistent etching caused by dirt, dust or impurities in the material being etched, and questionable etching chemistry. Thus, the use of this process will result in a significant reduction in labor costs and an increase in product yield.

This process offers other significant advantages over the conventional imaging and etching or additive (platingup) techniques normally used to make printed circuit conductive networks. For example, it allows the use of relatively low cost, relatively inferior metal sheets or foils with minor inclusions, impurities or voids which cannot be used in a process involving etching because this would result in non-uniform etch rates. Materials that cost as little as half as much as those required for etching may be used in the present process without any detrimental effects on the process or on the final product. Further, in the process of this invention, the throughput is the same for circuits whose metal foils have different thicknesses. This contrasts to the usual imaging-etching process wherein the line speed is directly proportional to the foil weight because it takes longer to etch thick foil than thin foil. The following is intended to summarize the versatility and technical advantages of the inventive process:

a) Elimination of hazardous chemical processing materials and related disposal expenses;

b) Once the electrical and mechanical characteristics of a circuit are established and built into the hardened steel template, there is circuit repeatability;

c) Equal effectiveness on high volume and intermediate volume jobs;

d) Base laminate may be fused (melted) to the formed conductive sheet eliminating the need for an adhesive (This can only be accomplished, without causing conductor distortion (swim), using the inventive process);

e) Elimination of common yield problems associated with conventional etched circuits such as, artwork distortion, dirt or dust, scratched resist, inconsistent etching chemistry, etc;

f) A significant reduction in direct labor costs;

g) Conductors can be plated with any surface finish;

h) The ability to produce a conventional copper circuit for less than ½ of direct manufacturing costs using etching techniques;

i) The ability to manufacture low cost, channelled conductors insulated with any flexible or rigid insulating material;

j) The ability to manufacture low cost, channelled conductors insulated and mounted to a second circuit network and/or to a support spring or component stiffener; and k) The ability to make high-density contact clusters for connector assemblies.

BRIEF DESCRIPTION OF THE DRAWINGS

The invention will now be described, by way of example, with reference to the accompanying drawings, in which:

FIGS. 8–13 illustrate a method according to a second embodiment of the invention for forming a circuit from a thin sheet of conductive material supported on a temporary compliant carrier;

FIG. 14 is a plan view, FIG. 15 is a cross-sectional view, taken along line 15—15 in FIG. 14 and FIG. 16 is a cross-sectional view taken along line 16—16 in FIG. 14, showing a portion of a circuit for illustrating embodiments of the invention in which a layer of conductive material is extruded into a non-planar pattern;

FIGS. 23–27 illustrate a fourth embodiment of the invention for forming a conductive circuit pattern in which a layer of conductive material is extruded to form a non-planar pattern and an unformed dielectric is applied thereto;

FIGS. 28–33 illustrate a method according to a fifth embodiment of the invention for forming ultra thin conductive circuits in which the conductive circuit is formed by extrusion and then machined from both sides thereof;

DETAILED DESCRIPTION OF PREFERRED EMBODIMENTS OF THE INVENTION

Figure 1:
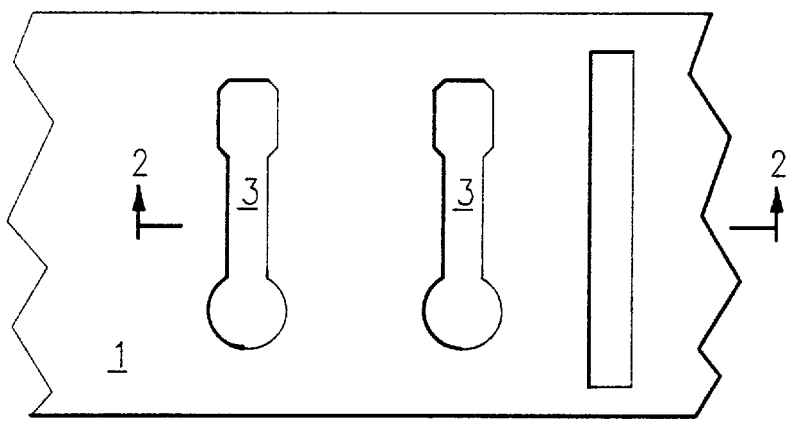
FIG. 1 is a plan view and FIG. 2 is a cross-sectional view, taken along line 2—2 in FIG. 1, of a portion of a circuit used to illustrate the formation of that circuit, out of a thin sheet of electrically conductive material, according to the invention.
Figure 2:
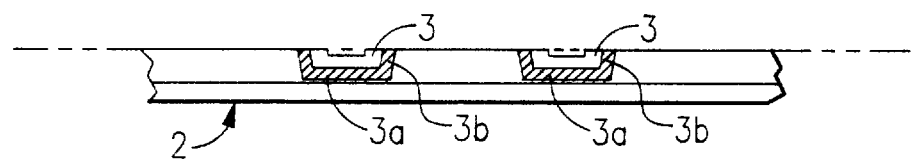

Referring to FIGS. 1 and 2, a flexible conductive network incorporating the invention is shown generally at 1. The network has a dielectric substrate 2 which carries densely packed conductive paths 3. Each conductive path 3 has a bottom wall 3a and a pair of spaced-apart inclined side walls 3b so that the cross-section of each conductive path 3 is trough-like. The bottom wall 3a is generally recessed from about 0.025 mm (0.001 inches) to about 0.127 mm (0.005 inches) below the surface of the conductive network.

Although conductive paths 3 depicted in FIGS. 1 and 2 are shown as being straight and parallel to one another, the conductive paths may have various patterns and follow different paths along substrate 2, or interconnect, provide contact pads and many other circuit features, depending upon the particular network application, by appropriately controlling the forming operation described below.

Embodiment 1

Forming A Conductive Network From A Thin Conductive Sheet Supported On A Dielectric Referring now to FIGS. 3 to 7, in the method according to the first embodiment of the invention, a desired circuit pattern with conductive paths 3 properly positioned in relationship to a reference plane 4 and supported by a dielectric 2 laminated to the conductor by an adhesive 5 (also a dielectric), is produced by the following steps.

Step a: A forming die 6 (FIG. 3) is provided that has a forming surface 7 with shaped features thereon for forming a conductive foil 8 (FIG. 4) into a non-planar pattern defining the final conductive circuits 3. The die 6 also has shaped features for controlling the flow of adhesive 5 underlying the conductive foil 8 during forming to accommodate material expansion and/or displacement and achieve a machinable surface.

The shaped features on the die 6 include raised circuit forming elements 9 to depress the conductive foil 8 into the adhesive 5 to form circuit features (FIG. 5), in the conductive foil 8, that define the desired conductive paths 3. By varying the width and height of the circuit forming elements 9, respectively, a variety of conductive path widths and thicknesses may be produced in the final circuit pattern.

Material displacement control grid features 10 are also provided on the die to depress the conductive foil 8 to capture and control the flow of adhesive 5 during forming. Moreover, the die 6 defines material expansion troughs 11 that allow the conductive material to be displaced upwards during forming (FIG. 5), thereby relieving compression stresses that would otherwise distort the circuit during machining. It is critical for accurate waste material removal that the adhesive 5 is displaced during forming and not compressed. The expansion troughs and control grid features are designed to stabilize the formed structure while maintaining a machinable surface parallel to the reference plane 4. The reference plane 4 is defined by a planar surface of the dielectric 2 remote from the conductive foil 8.

Precision die stops 12, designed to accurately control the location of each conductor in relationship to the reference plane 4, are provided on the die 6. The die stops 12 accurately control the die relative to the reference plane 4.

Step b: A laminate 13 is provided, (FIG. 4) consisting of a planar conductive metallic foil 8 (e.g., copper) of a suitable thickness, for example, about 0.04 mm (0.0014") and a flexible dielectric material 2, for example, 0.05 mm (0.002") thick Kapton sheet, is provided. The dielectric 2 is adhered to the conductive foil 8 by a layer 5 of dielectric adhesive material, for example, 0.12 mm (0.004") thick. If desired the foil may be plated as indicated by numeral 14.

The adhesive 5 is selected or conditioned using heat, pressure and/or formula modification, to have a viscosity that supplies a flowable compliant dynamic pressure cushion, i.e. it supports the conductive sheet throughout the process while flowing out from under the conductive features and filling all voids. To maintain the required dimensional relationship of the conductive foil relative to the reference plane 4 during waste removal, it is critical that the adhesive 5 flows out from under the depressed portions of the conductive foil 8 during forming without being compressed, thereby relieving compression stresses that are otherwise formed, and completely fills the spaces 16 between the circuit features to support the circuit features on three sides. Supporting the circuit features on three sides serves to stabilize, support and entrap the circuit features preventing their movement or delamination in subsequent processes. The quantity and fluidity of adhesive is controlled so that it suitably flows while providing the dynamic pressure cushion. The use of the die of step a) and dynamic pressure cushion eliminates the need for a second die half normally required to form thin sheets of metal. Suitable adhesive materials include, but are not limited to, epoxies, polyesters and application specific adhesives.

Figure 5:
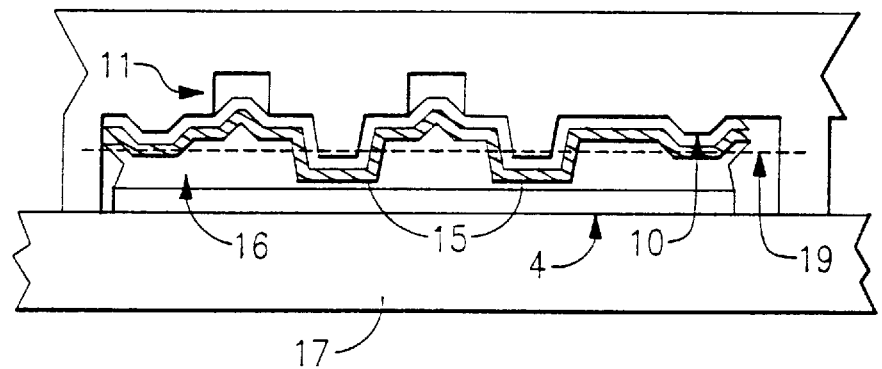
Figure 6:
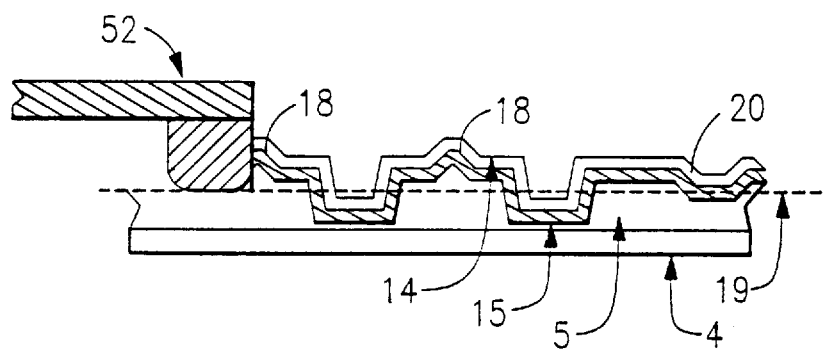

Step c: The laminate 13 is positioned beneath the forming die 6 on a substantially flat support platen 17. The substantially flat supported surface of the laminate 13 defines the reference plane 4. The laminate 13 is conditioned by pre-heating the laminate, before or after positioning the laminate on the support platen 17, to provide the dynamic pressure cushion and facilitate the process. Note: If an adhesive is chosen that has the appropriate viscosity without pre-heating, then pre-heating is not necessary. The die is pressed against the supported conductive foil 8, thereby pressing the conductive foil 8 into the adhesive 5 to form the conductive foil 8 into the non-planar pattern (FIG. 5). The appropriate heat and pressure is applied for the prescribed amount of time to cause the adhesive material 5 to flow out from under the circuit features 15 and fill the spaces 16 between these to support the circuit features on three sides and produce the structure shown in FIG. 6.

In order to accurately form the conductor the dimensional relationship between the reference plane 4 and the final position of the die 6 is accurately controlled by the precision die stops 12 contacting the support platen 17. It can be appreciated that the dies stops 12 may be provided on the support platen 17 rather than on the die 6. Moreover, the precision dies stops may be an electronic control, for example, a precision servo motor. This control is extremely important as it controls the shape and location of the conductors 8 as well as the waste removal operations. It is critical that the reference plane 4, i.e. the supported surface of the laminate 13, remains stable and substantially flat during forming and waste removal for providing a stable reference point for enabling accurate control of the forming and subsequent removal of the conductor 8 in dimensional relationship to reference plane 4.

The dimensional relationship of the conductor 8 relative to the reference plane 4 and control of the flow of adhesive 5 under the foil using the material displacement control grid features 10 on the die are required to achieve accurate waste removal. To maintain the dimensional relationship between the conductor 8 and the reference plane 4, the material expansion troughs 11 are designed to receive the displaced adhesive to avoid material compression that would cause the laminate to wrinkle and distort. Thus the expansion troughs 11 ensure that the supported surface of the laminate 3 remains flush against the support plate 17, thereby ensuring a stable substantially flat reference plane 4 having a natural flatness of ±0.005 mm (0.0002").

The displacement control grid features 10 are designed to ensure that the adhesive completely fills all voids so that the conductive sheet 8 is continuously supported at or even lifted and supported at the prescribed level relative to the reference plane 4 for accurate waste removal and so that the conductors 15 are supported by the adhesive on three sides preventing delamination. The displacement control grid features are arranged as a control grid that is dependent on the design of the final circuit configuration, the thickness of the foil, the viscosity and thickness of the adhesive and volume of the adhesive to be displaced.

The resulting non-planar pattern is characterized by a set of circuit features 15 that define the finished circuit pattern 3 and raised portions or ridges 18 of waste material.

Step d: The die 6 is removed and the laminate 13 (FIGS. 6 and 7) is then subjected to a precision metal removal process, which mechanically removes, by the use of a diamond fly cutter 52, or other suitable cutting tool, a desired quantity of waste metallic material 18 and adhesive 5 from the exposed metal side of the laminate. The waste material is removed down to the dashed machining line 19 (FIGS. 5 and 6), which is precisely determined in relation to the reference plane 4 at a level sufficient to remove the desired amount of waste material and form the electrically insulated conductive paths 3 depicted in FIGS. 1 and 2. The quantity of waste material removed is controlled by continuously monitoring the distance between the cutting tool and the reference plane. Machining with a diamond fly cutter produces clean, polished circuits eliminating the need to clean the circuits after machining. If not already plated, the conductive paths may then be plated with a desired finish coating (for example, gold, lead, or tin) to complete the conductive network 1. The conductive paths may be spaced, for example, 0.3 mm (0.012 inches) on center.

In some applications, the channeled conductors 3, 3a, 3b may not be required. For example, in building a flexible printed circuit requiring extreme flexibility, the side walls 3b, despite their thinness, reduce flexibility. Accordingly, in such circumstances waste material removing step d is continued downward beyond machining line 19 until flush conductors of the desired thickness lacking the side walls 3b have been achieved. By supporting the conductive paths on three sides they are firmly entrapped in the adhesive, thereby preventing the paths from delaminating during machining. Moreover, flush conductors simplify subsequent laminating operations and make it possible to pack more circuit layers in a given thickness.

It will be appreciated that the laminate 13 can be a preformed commercially available laminate having a suitable adhesive, for example, a thermoplastic adhesive which is heated to allow circuit formation. The laminate can also be custom made and may include a fluid or thermosetting adhesive in the Beta-phase (B-stage) during circuit formation. Alternatively, the conductive sheet 8 may be fused (for example, melted) directly to a flexible dielectric material having the necessary viscosity fluidity to provide the dynamic pressure cushion or that is heat treated to provide the necessary viscosity, thereby eliminating the need for a separate adhesive.

Figure 3:
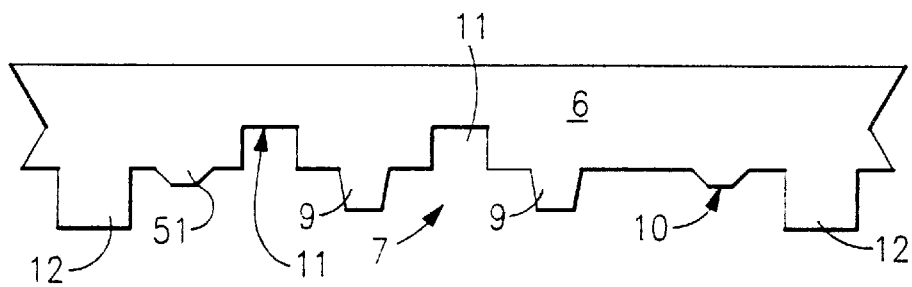
FIG. 3 is a cross-sectional view of a portion of a forming die used in the invention.
Figure 4:
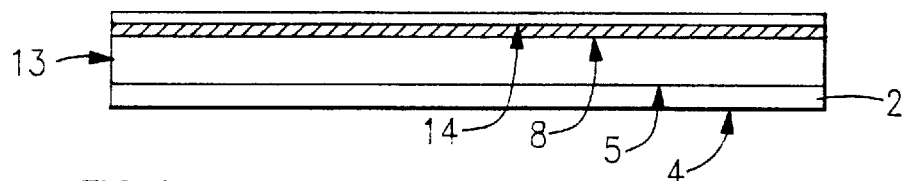
FIGS. 4–7 illustrate a method according to a first embodiment of the invention for forming a circuit from a thin sheet of conductive material supported on a dielectric.

Although the circuit forming features 15 in FIGS. 3 and 5 are shown as having a trapezoidal cross-section or profile, the die 6 can be designed to provide troughs of any desired open faced cross-sectional shape (for example, rectangular, hemispherical, ovular, V-shaped, etc).

By quick chilling the laminate as it is being formed or immediately thereafter, the adhesive and/or dielectric is quickly set up and stabilized. Also, in accordance with the invention, the dielectric material may be rigid rather than flexible, to produce a rigid printed circuit board having channeled or "flat" conductors.

Figure 7:
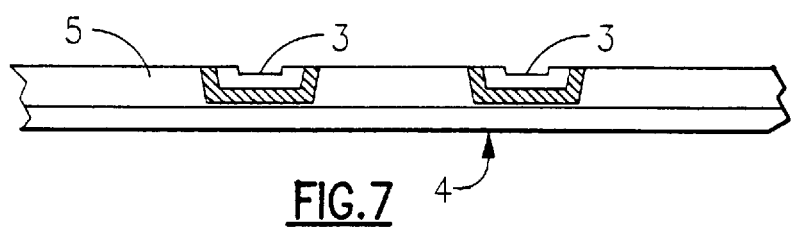
Figure 8:
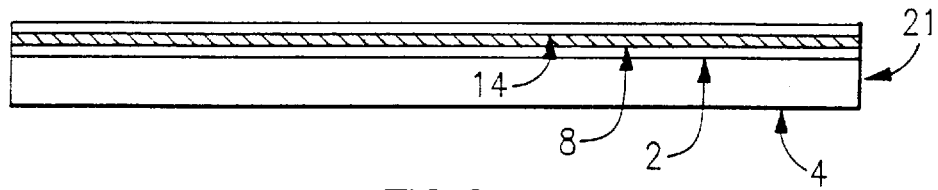
Figure 9:
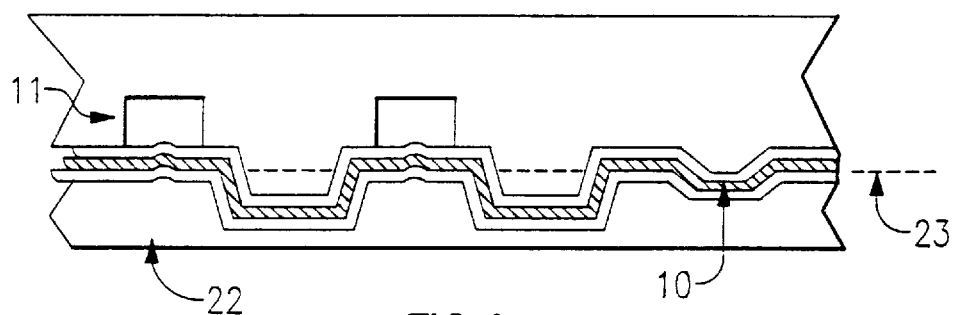
Figure 10:
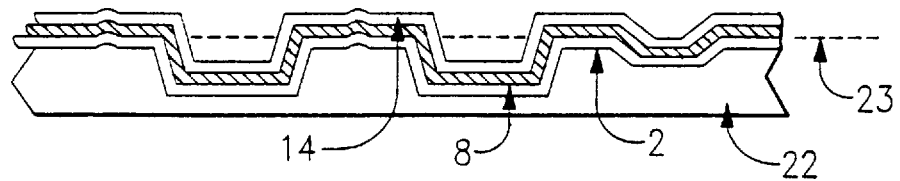

Although the die 6, support platen 17 and reference plane 4 as described above are substantially flat, the die may be a calendar roll and the support surface a backing roll. Moreover, although FIG. 7 shows the trough 20 formed by the displacement control grid feature 10 as being completely machined off, at least a portion thereof may remain after machining as shown in FIGS. 11–13.

Embodiment 2

Forming a Conductive Material or a Laminate into a Circuit Using a "Temporary Compliant Carrier"

A method according to the second embodiment of the invention is illustrated in FIGS. 8–13. In this method the desired circuit pattern with conductors 3 properly positioned in relationship to a reference plane 14 is produced by the following steps.

Step a: A forming die 6, as described above with reference to FIG. 3, having shaped features thereon for forming the conductive sheet 8 (FIG. 4) into a non-planar pattern defining the final conductive circuits 3, is provided.

Step b: (FIG. 8) A laminate 21 of a conductive metal copper foil 8 joined by a flexible dielectric adhesive 2 to a temporary compliant vinyl carrier 22 and any desired plating 14 of the foil is provided. The compliant carrier 22 is applied to the dielectric 2 to provide a substantially flat surface defining a reference plane 4 and to support the dielectric 2 and the conductive foil 8 and retain the structures dimensions through subsequent operations. Moreover, the compliant carrier 22 is selected or temperature or pressure conditioned (using heat and/or pressure) to have a suitable viscosity to provide the dynamic pressure cushion characteristics to receive, capture and support the formed structure.

For example, a vinyl carrier may be conditioned by heating to 250° F., at which temperature it is fluid enough to flow out from under the foil 18 but solid enough to support the foil.

In order to maintain dimensional stability of the laminate throughout the required circuit forming and finishing (metal removal and laminating) operations, it is important to establish and maintain reference plane 4. This reference plane 4 accurately defines the location of each conductor 3 in relationship to the exposed surface of the compliant carrier 22, and is used as the reference for controlling the removal of waste material and maintaining the desired conductor thickness. Therefore, the substantially flat surface of the temporary carrier must remain flush against its support surface to maintain a stable reference plane.

Step c: (FIG. 9) The conductive foil 8 is formed into a non-planar pattern by pressing the forming die into the laminate in the same manner as described in step c of Embodiment 1. In this embodiment, however, it is the flat under surface of the compliant carrier 22, not the dielectric 8, that is supported on the support platen 17 to provide the reference plane 4.

Step d: (FIGS. 10 and 11) The waste material is now mechanically removed, by the use of a diamond fly cutter, down to machining line 23, which is precisely determined in relation to reference plane 24, in the same manner as described in step d of Embodiment 1, leaving conductive paths 3 (FIG. 11). Note that, unlike Embodiment 1, a portion 20 of the sections of the conductive foil 8 that were depressed by the flow control grid features 10 remain after waste material removal (FIG. 11). These do not, however, form a part of the conductive network being manufactured.

Step e: (FIG. 12) A layer of dielectric, with a layer of adhesive thereon, is now applied to the machined surface to support and protect the conductive paths. This layer of dielectric is applied such that the adhesive completely fills all voids between the dielectric and the machined surface.

The (FIG. 13) compliant carrier 22 is heated and removed after the circuit is complete. (FIG. 13).

The compliant carrier 22 may be attached to the dielectric 2 prior to or simultaneously with forming of the foil 8. Furthermore, the foil 8 may be custom attached to the dielectric 2 or it may be purchased on the market as a preformed laminate. Moreover, the compliant carrier 36 may be attached directly to the conductive sheet 22 with or without adhesive.

As in Embodiment 1, in order to stabilize the structure it may be quickly chilled thereby setting-up and stabilizing the compliant carrier subsequent to or during forming. The compliant carrier is heated for removal subsequent to this chilling and the attachment of dielectric layer 2.

In embodiments 3, 4 and 5 of the invention described hereinafter, the conductive material (e.g. copper) itself provides the dynamic pressure cushion and a first reference plane for controlling the waste removal process. FIGS. 14 through 16 illustrate a circuit having flat conductors 25, sculptured bi-thickness conductors 26 and raised terminal pads and registration posts 27 that will be used below to describe these embodiments.

As shown in FIGS. 14–16 a dielectric layer 28 is adhered to the formed conductive material 29, using a layer of adhesive 30. In one embodiment the dielectric layer 2 is provided with pre-punched alignment holes 31 that are received over the registration posts 27 (FIG. 16) to accurately align the dielectric 2 with the conductors. In other embodiments the dielectric layer 2 is not prepunched and the registration posts are used to raise the dielectric to a level sufficient to allow the dielectric and adhesive overlying the registration posts to be removed during the removal step. FIG. 14 shows the circuit with the dielectric omitted so that the circuits are visible.

It will be appreciated that the conductive material in these embodiments may itself be a laminate, for example, copper fast with a substrate of aluminum.

Embodiment 3

Forming a Conductive Sheet into a Circuit by Extruding the Conductive Sheet and Attaching a "Temporary Compliant Carrier"

According to Embodiment 3, a supported conductive circuit with the conductors 25, 26 properly positioned in relationship to a reference plane 32 is formed by the following steps described with reference to FIGS. 17–22.

Step a: A forming die 6, similar to that described in step a of embodiment 1 with reference to FIG. 3, for forming a solid layer of conductive material 29 into a non-planar pattern defining the final conductive circuits 3, is provided.

Figure 17:
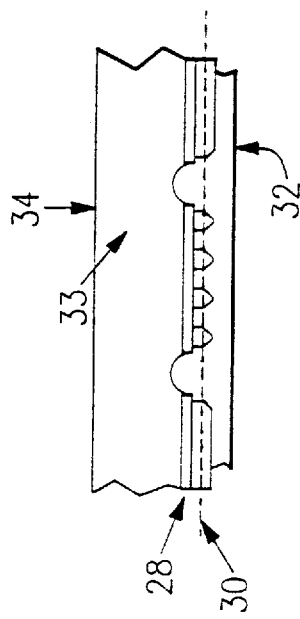
FIGS. 17–22 illustrate a third embodiment of the invention for forming a conductive circuit in which a layer of conductive material is extruded to form a non-planar pattern and preformed dielectric is placed thereon.
Figure 18:
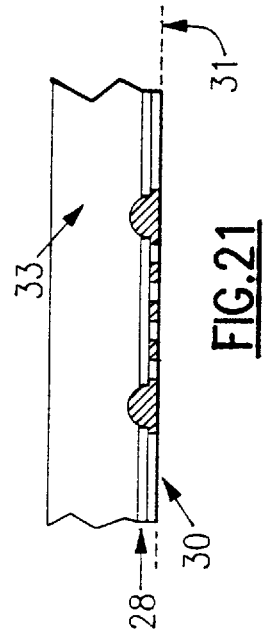
Figure 19:
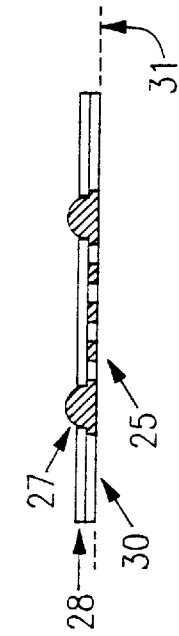

Step b: A solid sheet of copper 29 having substantially planar surfaces, one of which is supported on a support platen and defines the first reference plane 32, is provided (FIG. 17). Thus, the need to attach a separate substrate, for example, a dielectric or temporary carrier, to define the reference plane is eliminated. This "reference plane" 32 is critical to proper waste removal and conductor shaping (thickness, width and configuration).

Step c: (FIG. 17) The conductive material 32 is extruded, by pressing the forming die 6 into the conductive material against a planar support platen in contact with the first reference plane 32, thereby forming a non-planar pattern defining the desired conductive features 25, 26, 27. By strictly controlling the extrusion process relative to the first reference plane 32 using die stops as described in Embodiment 1, the required control dimensions are held within a tolerance of ±0.0025 mm (0.0001") measured from the conductor's surface to the first reference plane 32. (FIG. 17)

The forming step is said to extrude the conductive material because when the forming die 6 is pressed into the conductive material 29, the material flows out from under the circuit forming features 9 and is extruded up into the terminal pad recesses and into the recessed circuit forming elements, thereby extruding the terminal pads 27 and the circuits 25, 26 up into the forming die.

Terminal pads 27 are also raised registration posts that are used to accurately align and lock the dielectric in place throughout the machining process. The posts and pads could, however, be separate features.

Step d: (FIGS. 18 and 19) A pre-punched dielectric layer 28, having adhesive layer 30, also dielectric, thereon, is applied over the extruded conductive material 27, 25, 26, the adhesive 30 being sufficiently fluid to completely fill all the spaces between the conductors 25, 26 and between the conductors and the dielectric layer 28. (FIG. 19) The dielectric layer is accurately positioned over the extruded circuit pattern 25, 26 by passing prepunched openings 31 over the registration posts/contact pads 27. (FIG. 19) Any desired surface finish (not shown) may be plated onto the exposed circuit features using base 29 as a common plating buss.

Figure 20:
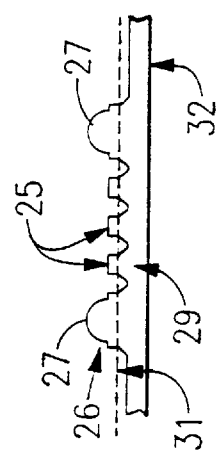
Figure 21:
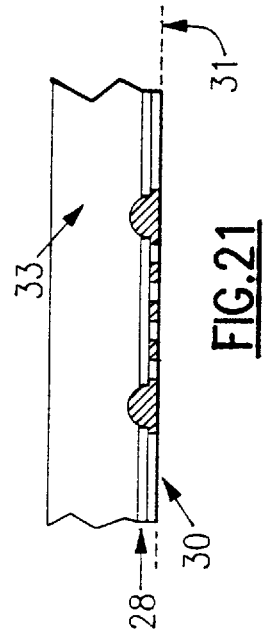
Figure 22:
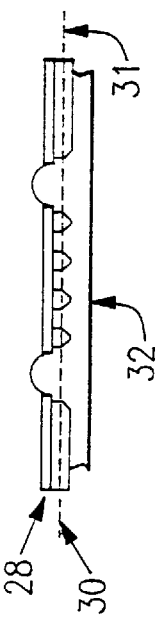
Figure 30:
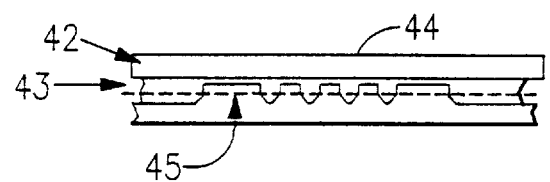
Figure 31:
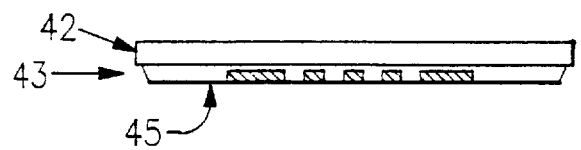
Figure 32:
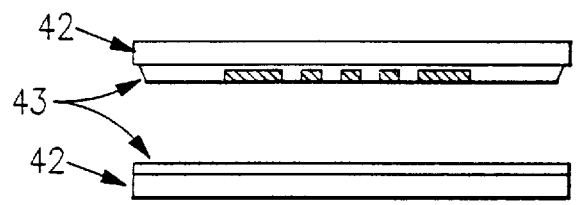

Step e: (FIG. 20) A temporary, "compliant carrier" 33 is now applied over the dielectric 28 to support and protect the uninsulated conductor pads 27 throughout the subsequent machining operation. The "compliant material" 33 (e.g. a low temperature vinyl) is heated and applied over the dielectric 28 using a conventional roll laminating process. This process precisely applies the material 33 over the dielectric 28, filling-in all low spots and establishing a second reference plane 34 in precise dimensional parallel relation to the first reference plane 32. The second reference plane 34 is defined by the surface of the compliant carrier 33 opposite the extruded conductor material 29 (FIG. 20).

Step f: (FIGS. 20, 21) The waste material is removed, using a diamond fly cutter, from the extruded conductive material 29 up to machining line 31 using the "second" reference plane 34 to control the removal of conductive material and define the final shape and thickness of the finished conductor. Hence, the first reference plane 32 here serves only as an intermediary for controlling the forming step and application of the second reference plane 34.

Step g: (FIG. 22) Finally the temporary compliant carrier 33 is removed (by heating and peeling) leaving the finished supported conductive circuit.

The steps of attaching the dielectric 28 and attaching the "compliant carrier" 33 may be performed simultaneously. It can also be appreciated that the compliant carrier may be left in place for supporting and protecting the circuit.

Embodiment 4

Forming a Conductive Sheet into a Circuit by Extruding a Conductive Sheet to Form Raised Features and Covering these with a Layer of Unpunched Dielectric Material This embodiment according to the invention, described with reference to FIGS. 23–27, eliminates the technical and cost limitations related to preparing and applying the prepunched dielectric layer of the previous process and provides low cost removal of dielectric from the terminal pads 27 by providing the following steps.

Steps a, b and c: A die (step a) and a solid sheet of copper 29 (step b) are provided as in steps a, and b of embodiment 3. The conductive material is extruded into a non-planar pattern (step c) defining circuit elements 27, 25, 26 on one face thereof in relation to a first reference plane 32 supported on a planar support platen as described in step c of embodiment 3. (FIG. 23)

Step d: (FIGS. 24 and 25) A dielectric layer 35, without the prepunched openings 31 disclosed in embodiment 3, having an adhesive layer 36 thereon is applied to the circuit feature defining face of extruded conductive sheet 29 (FIG. 25) filling all voids as described in step d of embodiment 3 and covering all of the circuit features 27, 25, 26.

Step e: (FIG. 26) The raised portions of the dielectric 35 are precisely mechanically removed down to machining line 37, determined in strict dimensional relation to the first reference plane 32, thereby exposing terminal pads 38 of circuits 26. The machining removes the tops of the terminal pads 27 to form exposed pad areas 38 that are flush with the exposed surface of the dielectric 35 (FIG. 26). If desired the exposed circuit features may be appropriately plated (not shown).

The dielectric 35 is precisely removed relative to the first reference plane 32 using a high speed diamond fly-cutter, such that the resulting surface is substantially planar and defines a second reference plane 39 parallel and accurately located relative to the first reference plane.

Step f: The waste material is now removed from the extruded conductive material 29 up to machining line 40 using the second reference plane 39 to control the removal of conductive material 29 and define the final shape and thickness of the finished conductors 25, 26 leaving the final circuit pattern (FIG. 27).

Advantages of the fourth embodiment over the third embodiment are a) reduced Labor, due to reduced material preparation (no drilling or punching of through holes), and handling (no need to alignment holes with terminal pads), b) flush terminal pads offer a significant advantage to those manufacturers choosing to attach surface mounted components.

Embodiment 5

Forming a Conductive Material into a Circuit by Extruding the Conductive Material and Machining the Extruded Conductive Material on Both Sides Machining the conductive circuits on both sides according to this method of the invention enables the production of ultra thin fine line circuits with (e.g. 0.013 mm (0.0005") thick) conductors. It also produces a conductor that is flat on both surfaces and that has a uniform thickness regardless of the conductor width, using an inexpensive, inconsistent, etched template. In this approach, as in the previous embodiment, a reference plane 32 is utilized. A conductive circuit is formed according to embodiment five described with referenced to FIGS. 28–34 as follows.

Steps a, b and c: A die (step a) and a solid sheet of copper 29 (step b) are provided as in steps a, and b of embodiment 3. However, a cheap etched die is provided in this embodiment. The conductive material is extruded into a non-planar pattern (step c) defining circuit elements 25, 26 relative to a first reference plane 32 that is supported on a planar support platen as described in step c of embodiment 3. The resulting conductors have differing thickness, due to the low cost etched die (template), (FIG. 28).

Step d: (FIGS. 28 and 29) Waste material is removed down to machining line 41 based on the first reference plane 32, leveling all the conductors 25, 26 to a uniform thickness relative to the first reference plane 32 (FIG. 29). In this embodiment, control dimensions are measured from the flat base of the formed conductor, i.e. the reference plane 32, to the exposed machined surface of the conductors 25, 26 which are formed within a tolerance of ±0.0025 mm (0.0001").

Step e: (FIG. 30) A dielectric layer 42 having a layer of adhesive 43 thereon, is precisely applied to the formed machined conductors 25, 26 establishing a second reference plane 44 parallel to and accurately positioned relative to the first reference plane 32. The dielectric layer 42 is applied such that the adhesive 43 fills all voids between the conductors 25, 26 and between the conductors and the dielectric 42.

Step f: (FIG. 31) Using the second reference plane 44, the waste material is precisely removed up to the machining line 45 reducing the conductors to their final thickness and in so doing defining the finished circuit pattern to an accuracy of 0.0001 mm (0.0001") due to the accurate control resulting from the use of the reference planes 32, 44.

Figure 33:
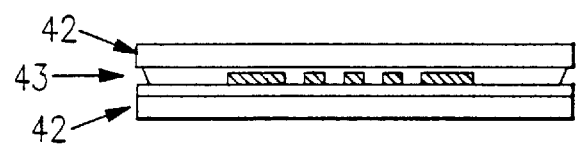

Step g: (FIGS. 32 and 33) If a second insulating dielectric is required it is easily laminated in place as the conductors 25, 26 are flush with the adhesive (FIG. 32) and there are no raised conductors to emboss over. The fact that a dielectric is not being embossed over conventional conductors also greatly improves the circuit's dimensional stability. The conductive material may be heat treated to reestablish the desired metal temper as necessary. Moreover, in applying the second dielectric, the residual (stored) heat may be used to fuse the dielectric(s) to the formed metal. (FIG. 33)

Figure 34:
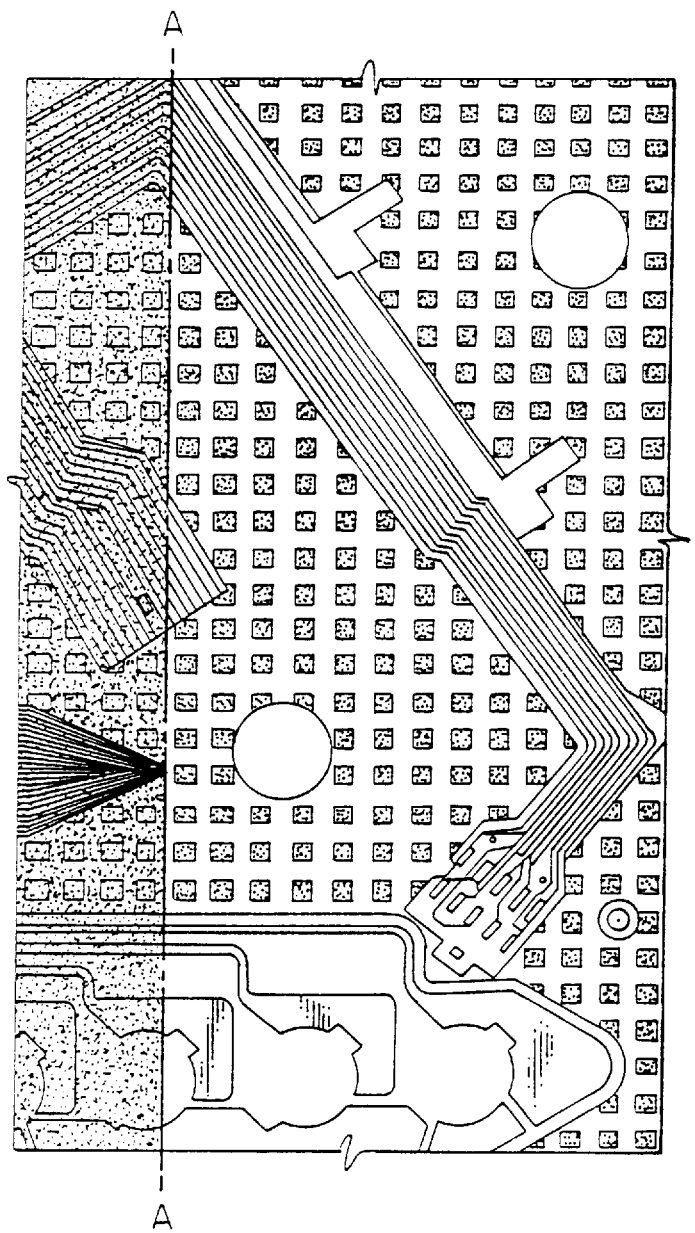
FIG. 34 illustrates a portion of a circuit produced in accordance with the present invention showing various features of the circuit.

An example of a circuit with features formed by a die having a control grid according to the invention is shown in FIG. 34 in which the waste material has been removed from the laminate on the right side of line A—A, but not on the left side of line A—A. Control grid features in FIG. 34 partially remain after machining and can be seen as rows of small squares located in the areas between the circuit paths.

The control grid must be designed to control the flow of the adhesive or the dielectric substrate during forming such that the conductive material is deformed into two, three or more levels, i.e. the waste material level, and various circuit levels, in planar configurations. The control grid must also control the flow of the adhesive or dielectric so that the various levels are supported on three sides by the adhesive or dielectric without any voids being created. All of this must be done while maintaining a flat reference surface in strict dimensional relation with the various material levels.

The control grid and expansion troughs must also control the flow of the adhesive or dielectric such that the adhesive or dielectric is displaced and not compressed. The expansion troughs allow the adhesive or dielectric to be displaced upwards into the die relieving any compression stresses that would distort the formed structure. Thus the supported surface of laminate remains flush against the support platen 17 providing a stable, flat reference plane, which the known methods are unable to produce.

When the forming die is a cylindrical forming roll and the conductor is formed by feeding the conductor between the forming roll and a support surface, the control grid helps keep the dielectric or adhesive from flowing to either side, relative to the direction of travel of the conductor. The control grid thus helps ensure that the flow of adhesive or dielectric is uniform across the width of the conductor as it is fed between the forming roll and the support surface, thereby providing transverse dimensional uniformity in the formed non-planar pattern.

The design of the control grid is dependent on the geometry of the final circuit to be formed, the thickness of the adhesive or dielectric layer and the volume of the adhesive or dielectric to be displaced during forming. The volume of adhesive or dielectric to be displaced is calculated from the length, width, thickness and spacing of the conductors to be formed. From this information, the width, length, thickness and location of the forming die's displacing features, including displacement grid, and/or expansion troughs can be determined.

Because each circuit configuration is different, there is no set formula for designing the forming die. Each forming die must be designed to achieve the desired result based on the material characteristics and configuration of the circuit to be formed.

In order to precisely control the depth of cutting during waste removal, the forming die may also include one or more machining depth of cut indicator forming elements 51 (FIG. 3) for forming machining depth of cut indicators in the conductor. The depth of cut indicator forming elements 51 are sized to form the cut indicators such that the unexposed (lower) surface of the indicator is at a level relative to the reference plane that is at the same level as, or just above, the exposed surface of the conductors. Subsequently, as the waste material is being removed the machining depth of cut indicator is optically or electrically monitored. In one arrangement, when the indicator is removed it indicates that the proper depth of cut has been achieved and cutting is controlled at that depth thereby ensuring precise control of cutting depth.

It is noted from the foregoing that the process of this invention allows the production of fine-line flexible conductive networks (for example, circuits and jumpers) and conventional, high volume, printed circuit boards at relatively low cost through an environmentally desirable process.

As will be appreciated, the process of the present invention is very versatile and permits the creation of a conductive pattern in one or more of the various embodiments herein described.

The present invention also permits the production of sculptured (3 dimensional) circuit networks in which portions of the network are thicker than others thereby to provide, for example, rigid contact areas with flexible interconnects. This is accomplished by creating the appropriate three dimensional forming die which includes the desired features, for example see FIGS. 14–16, utilizing a conductive material or composite material laminate, which is then formed as hereinbefore described.

Conductor networks and/or their terminating points, in accordance with the present invention, may be plated with any surface finish because the present invention has the ability to manufacture conductor networks from a sheet or roll of conductive material on which a suitable contact finish (for example, gold) has been previously placed or inlaid. This approach is only practical with the process of the present invention as the process mechanically defines each conductor by grinding off unwanted waste material between each conductor thereby easily removing any unwanted gold. This contrasts sharply with conventional etching systems used to create printed circuit boards as conventional etching solutions will not remove gold and therefore would require additional processing steps. Consequently, the present invention significantly reduces both costs of applying and selectively removing the desired contact finish.

The final conductive paths and their terminating points can be designed to any specific electrical parameter (for example, power and signal) or configuration. For example, the controlled impedance of each conductive path can be selected to suit a particular application by appropriately controlling its configuration and/or its relationship to an electrically conductive support structure (for example, a spring layer or shield) if any. It is important to note that although conductors and/or their terminating points can be plated with any surface finish, if a conductor pattern is not electrically connected to a common plating bus, the gold, by example, must be plated on before the conductive paths are electrically isolated.

Further, depending on the use of the conductive network, the conductive paths can be insulated with a pre-windowed protective overlay or solder mask. Suitable insulating materials include but are not limited to, Kapton, Mylar and Teflon. This protective overlay provides a means to construct multi-layer conductive networks (for example, multi-layer circuit boards) or to add shielding material to the conductive network.

In embodiments in which the dielectric material is adhesively attached to the copper, the circuit pattern may be formed in the copper layer with the dielectric material undeformed. Here the adhesive is displaced to allow the pattern formation and to fill the voids otherwise produced. The conductive network can be insulated with a protective overlay, if required, and may be used to produce multi-layer circuit boards overlaying one another with appropriate protective intermediate dielectric material insulating the boards except where contact is desired through openings or windows.

Pressure fused interconnections can be easily created to join two conductive sheets, one of which has stress hardened domes located at the points to be interconnected, using high pressure rollers. This is accomplished with the two sheets of conductive networks registered to each side of a prepunched windowed flexible dielectric layer. The flexible dielectric material, for example, 0.055 mm (0.002 inches) thick, may be polyester. The stress hardened domes produce pressure fused interconnections as they pass through the high pressure rollers. In additional each interconnect is structurally reinforced by the laminating process.

Figure 35:
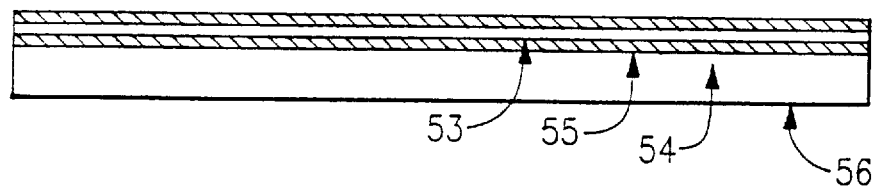
FIGS. 35–37 illustrate a method according to a sixth embodiment of the invention for simultaneously producing multiple layers of conductive circuits separated by an intermediate layer(s) of dielectric.
Figure 36:
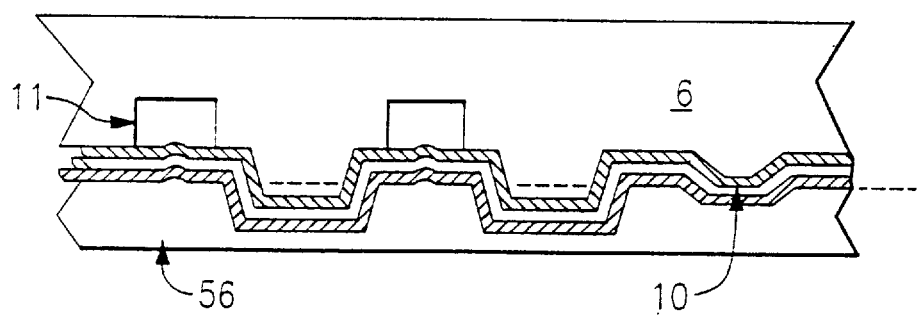
Figure 37:
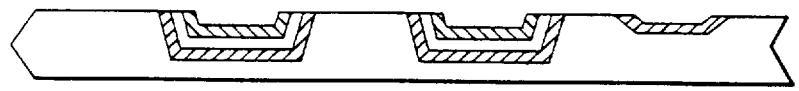

The laminate provided in the first and second embodiments may comprise two or more conductive layers, i.e. sheets 53, 54 of copper or other conductive metallic material, connected by an intermediate layer(s) of dielectric or adhesive 55 (FIG. 35). During forming (FIG. 36) both conductive layers may be formed at the same time such that a plurality of layers of conductive paths remain after a single waste removal process. (FIG. 37).

Two different conductive networks may be formed on opposite sides of the laminate shown in FIG. 35 by providing a first compliant carrier 56 defining a first reference plane, deforming the first conductive layer 53 in a first forming step, and leaving a first network of conductive paths in a first waste removal step. Next, a dielectric or a second temporary compliant carrier is applied to the machined surface providing a second reference plane and the first carrier is removed. A second network of conductive paths is now produced by forming the second conductive layer 54 in a second forming step and removing waste material in a second waste removal step.

In an alternative embodiment the laminate or conductive sheet or layer of all the disclosed embodiments is provided as a continuous sheet of material supplied on a roll, and the forming die is a forming roller. In this embodiment the continuous sheet is fed between the forming roller and a support surface, after any desired temporary compliant carrier etc. is applied, forming the sheet into the non-planar pattern. The waste removal and any other desired procedures are performed on the sheet, i.e. application of a dielectric, and the continuous sheet having the desired conductive paths formed therein is wound onto a receiving roll. In this manner the formed circuits may be stored as a roll of circuits that are conveniently unrolled and cut from the continuous sheet as desired. The roll of circuits also provides an advantageous, compact package of circuits for storage and shipment.

By utilizing a forming roller having a control grid, expansion troughs and precision die stops, as disclosed above, the present invention controls the flatness of the formed circuit, relative to the reference plane, to within 0.005 mm (0.0002") across a 30.5 cm (12"), minimum, wide roll of material that is typically 635 cm (250") long.

I claim:

1. A forming die for use in manufacturing a network of supported electrically conductive paths, having an electrically conductive lamina supported on a dielectric substrate, said conductive lamina being formed in a non-planar pattern defining desired electrically conductive paths at least at a first level, areas of unwanted waste conductive material at a second level, and flow control grid features located in the areas of waste conductive material and spaced from the desired conductive paths by the waste conductive material; said die comprising;

a forming surface defining conductive path forming features for forming the conductive lamina into said conductive paths, and defining flow control grid forming features for forming the conductive lamina into said flow control grid features, said grid forming features being spaced from said conductive path forming features and being sized, shaped and arranged for controlling the flow of the substrate, as the lamina is being formed, to relieve compression stresses and to fill any voids created during forming, to insure that the substrate supports the lamina at desired levels.

2. A forming die according to claim 1, wherein the dimension and arrangement of the flow control grid features are determined by the width, thickness and shape of the conductive paths, the material forming the substrate, the thickness of the substrate and the volume of substrate material to be displaced during forming.

3. A forming die according to claim 1, wherein the lamina is a conductive metallic foil and the substrate is a dielectric substrate, said die comprising:

the path forming features are raised above the forming surface of the die for depressing portions of the foil into the substrate defining the desired conductive paths as recesses in the foil;

the grid features are raised above the forming surface for depressing portions of the foil, between the recesses, into the substrate for controlling the flow of the substrate during forming.

4. A forming die according to claim 3, comprising material expansion troughs recessed in the forming surface for allowing portions of the foil to be pressed up by the substrate during forming for relieving compression stresses that would otherwise be created in the substrate.

5. A forming die according to claim 1, comprising die stop means for stopping the motion of the die relative to the reference plane to insure that the lamina is formed to the desired levels during forming.

6. A forming die according to claim 5, wherein said die stop means comprises die stop elements that extend from the die.

7. A forming die according to claim 1, wherein the substrate is integral with the metallic lamina, said die comprising:

the path forming features are recesses in the forming surface of the die for receiving metallic material therein during forming, thereby defining the desired conductive paths as extruded ridges on the metallic layer;

the grid features are raised above the forming surface for depressing portions of the lamina for controlling the flow of the layer during forming.

8. A forming die according to claim 7, comprising material expansion troughs recessed in the forming surface for allowing portions of the lamina to be extruded up during forming for relieving compression stresses that would otherwise be created in the lamina.

9. A forming die according to claim 7, comprising die stop means for stopping the motion of the die relative to the reference plane to insure that the lamina is formed to the desired levels during forming.

10. A forming die according to claim 9, wherein said die stop means comprises die stop elements that extend from the die.

\* \* \* \* \*